United States Patent
Das

(10) Patent No.: US 7,564,391 B2
(45) Date of Patent: Jul. 21, 2009

(54) SIGMA DELTA MODULATOR SUMMING INPUT, REFERENCE VOLTAGE, AND FEEDBACK

(75) Inventor: Abhijit Kumar Das, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/946,060

(22) Filed: Nov. 28, 2007

(65) Prior Publication Data

US 2009/0135038 A1    May 28, 2009

(51) Int. Cl.
*H03M 3/00*    (2006.01)
(52) U.S. Cl. .............. 341/144; 341/118; 341/120; 341/155
(58) Field of Classification Search ............. 341/143, 341/155, 118–122
See application file for complete search history.

(56) References Cited

U.S. PATENT DOCUMENTS

| | | | | |
|---|---|---|---|---|
| 5,150,120 A | * | 9/1992 | Yunus | 341/143 |
| 5,500,645 A | * | 3/1996 | Ribner et al. | 341/143 |
| 6,075,820 A | * | 6/2000 | Comino et al. | 375/245 |
| 6,107,947 A | * | 8/2000 | Lyden | 341/143 |
| 6,275,177 B1 | * | 8/2001 | Ho et al. | 341/143 |
| 6,275,540 B1 | * | 8/2001 | Barrett et al. | 375/316 |
| 6,538,588 B1 | * | 3/2003 | Bazarjani | 341/143 |
| 6,683,550 B2 | * | 1/2004 | Al-Awadhi | 341/143 |
| 6,920,182 B2 | * | 7/2005 | Bolton, Jr. | 375/247 |
| 6,930,625 B1 | * | 8/2005 | Lin | 341/143 |
| 7,193,544 B1 | * | 3/2007 | Fitelson et al. | 341/143 |
| 7,420,494 B1 | * | 9/2008 | Schreier | 341/143 |
| 7,432,841 B1 | * | 10/2008 | Kinyua | 341/143 |
| 2006/0227027 A1 | * | 10/2006 | Doerrer et al. | 341/143 |

* cited by examiner

*Primary Examiner*—Linh V Nguyen
(74) *Attorney, Agent, or Firm*—Lawrence J. Bassuk; W. James Brady; Frederick J. Telecky, Jr.

(57) ABSTRACT

A multibit sigma delta modulator for conveting an analog input signal (Vin) into a multibit digital output signal is disclosed. In one embodiment, the multibit sigma modulator includes a first analog filter for filtering the analog input error signal, a quantizer including multiple single bit noise shaped modulators for quantizing the filtered analog input error signal outputted by the first analog filter for generating a multibit digital output signal, and a first feedback arrangement with at least one digital-to-analog converter (DAC) coupled to the quantizer for supplying to the first analog filter at least one quantizer feedback signal based on the multibit digital output signal.

3 Claims, 2 Drawing Sheets

SIGMA DELTA MODULATOR SUMMING INPUT, REFERENCE VOLTAGE, AND FEEDBACK

FIELD OF TECHNOLOGY

The present invention is related to analog to digital converter device and more particularly, the present invention pertains to quantizer devices used for analog to digital conversion.

BACKGROUND

Many signal processing systems use multibit sigma delta modulators that include a quantizer to quantize an input signal into multiple bits. Generally, such quantizers consist of multiple comparators that are either based on a flash-type or tracking ADC (analog-to-digital converter) to deliver the multiple bits.

A fundamental problem with such multibit signal delta modulators is the so called offset error of the multiple comparators that are used in the quantizers for the quantization of the signal supplied. Such a comparator offset error can, for example, lead to the fact that for an input signal that lies just underneath the comparator threshold, the comparator output signal can assume a value that is stipulated for input signals lying above the comparator threshold. The reverse case is also conceivable. Comparator offset voltages represent the minimum DC input voltage that would have to be applied to input terminals of the comparator to cause the comparator to transition state.

The offset error can thus lead ultimately to the fact that under certain circumstances the comparator concerned comes to the incorrect decision. This error can affect the quality of the sigma delta modulators disadvantageously. This problem is particularly serious if the quantizer has multiple comparators in order to deliver a comparison result with multiple bit resolution. In this case not only does the offset error of a comparator as such possess relevance for the conversion quality, but so also does the fact that the individual offset errors of the majority of comparators differ from one another in an undefined manner. Thus, the comparator offset voltages can cause error in the comparator outputs, especially when the difference between the reference input signals adjacent comparators is small. This error offset error can restrict the speed at which these comparators can operate.

Traditional approach to reduce this offset error effect is to either increase device size of the comparator or by adding wideband high gain blocks before them. When the device size is increased it can reduce the maximum speed of operation of the comparator and hence can limit the speed of the overall multibit sigma delta modulators. This can also introduce huge kickback noise to a stage before the comparator. When the wideband high gain blocks are used before the comparators to suppress the offset problem, it can also significantly increase the power consumption. In addition, the parasitic poles of the wideband gain blocks may reduce the performance of the multibit sigma delta modulators. In most instances a trade off of the above two techniques are used. Another current approach requires reducing comparator clock speed to reduce the offset error. However, this can lead to a reduced speed of operation of the modulator and hence can lower the modulator performance.

BRIEF DESCRIPTION OF THE DRAWINGS

Example embodiments are illustrated by way of example and not limitation in the figures of the accompanying drawings, in which like references indicate similar elements and in which.

DETAILED DESCRIPTION

A new approach for multibit sigma delta modulators is disclosed. In the following description, for purposes of explanation, numerous specific details are set forth in order to provide a thorough understanding of the various embodiments. It will be evident, however, to one skilled in the art that the various embodiments may be practiced without these specific details.

The terms "comparator" and "zero detector" are used interchangeably throughout the document.

Figure 1:
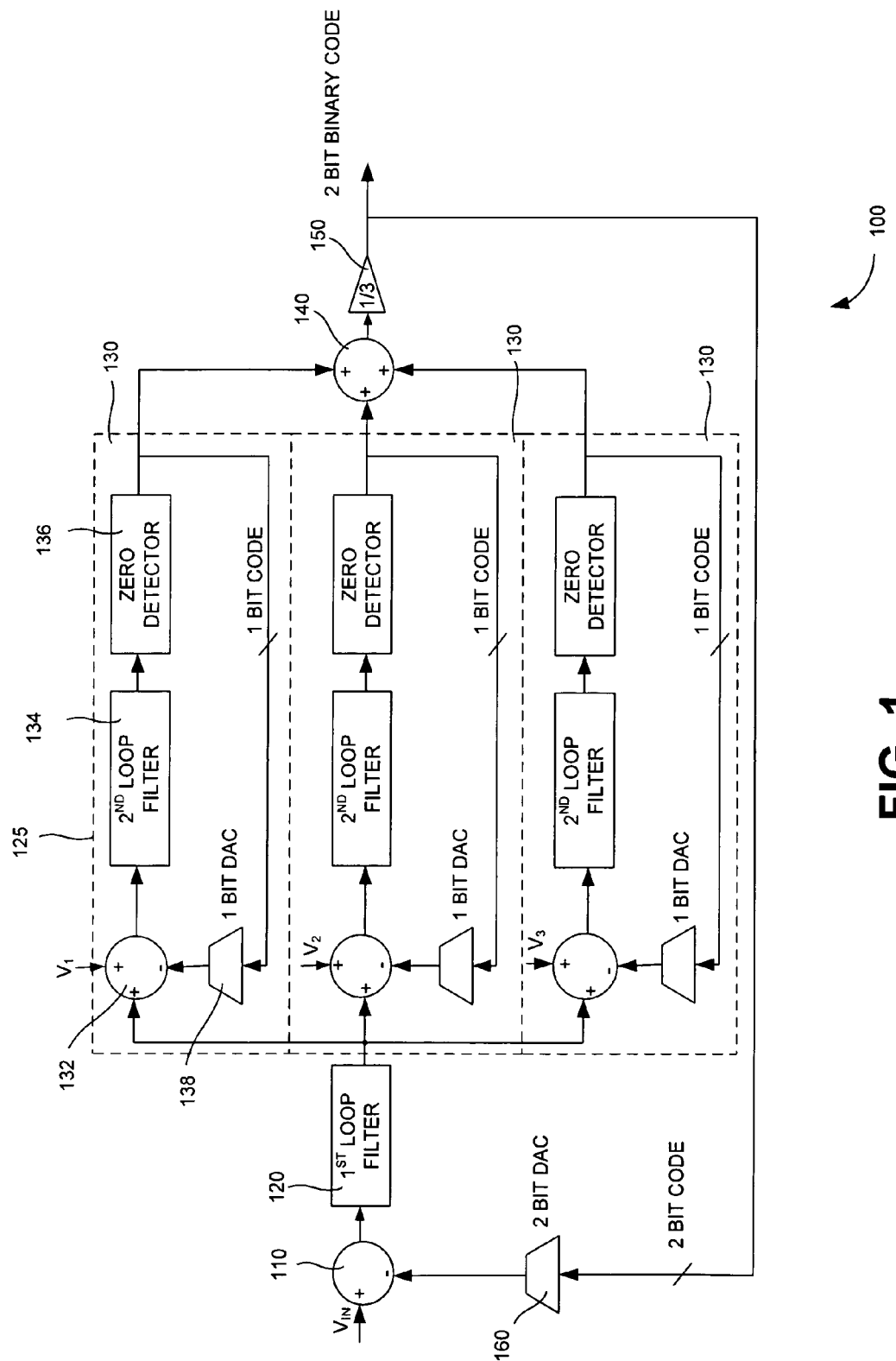
FIG. 1 illustrates a block circuit diagram of a 2 bit sigma delta modulator, according to one embodiment.

FIG. 1 a block circuit diagram 100 illustrating a 2 bit Sigma Delta Modulator (SDM), according to one embodiment. As shown in FIG. 1, the block diagram 100 includes a first summer/subtractor 110, a first loop filter or a first analog filter 120, a quantizer 125 including three single bit noise shaped modulators 130, a third summer/subtractor 140, an amplifier 150, and a 2 bit DAC 160 for converting an analog input signal ($V_{in}$) into a 2 bit digital output signal. Further, each single bit noise shaped modulator 130 includes a second summer/subtractor 132, a second analog filter or a second loop filter 134, a comparator or a zero detector 136, and a second feedback including a single bit DAC 138 to generate an associated digital signal.

In operation, the first summer/subtractor 110 is used to receive the analog input error signal and combine the quantizer feedback signal with the received analog input error signal to generate a first intermediate error signal. Further, the generated first intermediate error signal is outputted to the first analog filter 120. The first analog filter 120 filters the analog input error signal. In one embodiment, the first analog filter 120 filters the first intermediate error signal.

In operation, the quantizer 125 includes three single bit noise shaped modulators 130 for quantizing the filtered analog input error signal, outputted by the first analog filter 120 for generating the 2 bit digital output signal. In these embodiments, the second summer/subtractor 132 is used to combine the filtered analog input error signal and a reference signal to produce a second intermediate error signal. In one embodiment, a reference signal generator is used to generate multiple reference signals (e.g., the reference signals $V_1$, $V_2$, and $V_3$ illustrated in FIG. 1) associated with the three single bit noise shaped modulators 130.

In one example embodiment, the reference voltages corresponding to $V_1$, $V_2$ and $V_3$ are selected as +V (positive reference voltage), $V_0$ (neutral reference voltage) and −V (negative reference voltage) respectively. In some embodiments, different offset voltages are provided at the input of each of the single bit noise shaped modulators 130.

In operation, the second analog filter 134 is used to filter the second intermediate error signal. Further, the filtered second intermediate error signal is outputted to the comparator 136. The comparator 136 is configured to receive the filtered second intermediate error signal for generating an associated digital signal.

Further, each single bit noise shaped modulator 130 includes a second feedback arrangement with a Digital-to-Analog Converter (DAC) 138 coupled to the comparator 136 for supplying to the second analog filter 134 an analog feedback signal, based on the associated digital signal. In these embodiments, each of the comparator 136 has a local feedback loop. In one embodiment, each of these comparators 136 together with the local feedback loop (i.e., the associated second feedback loop), works as a single bit comparator 136 which has the quantization noise, shaped by the 2nd loop filter 134. Further, the second feedback loop corrects the offset of the comparator 136. As a result, the system may become more tolerant to the comparator offset.

In operation, the third summer/subtractor 140 is configured to receive the digital output signal from each of the three single bit noise shaped modulators 130 and to output 2 bit digital output signal (i.e., 2 bit binary code as shown in FIG. 1).

Further, the amplifier 150 is configured to receive the 2 bit digital output signal and to amplify the quantizer feedback signal. Further, a first feedback arrangement with a Digital-to-Analog Converter (DAC) 160 coupled to the quantizer 125 supplies to the first analog filter 120 a quantizer feedback signal based on the 2 bit digital output signal. In these embodiments, a 2 bit DAC 160 is coupled between an output of the amplifier 150 and the first summer/subtractor 110 for converting the quantizer feedback signal to an analog feedback signal.

In one embodiment, the comparators 136 were actually emulating a 2 bit quantizer. Output of each of the single bit noise shaped modulators 130 is added digitally and fed back to the rest of the SDM. In these embodiments, mismatch between the three individual single bit noise shaped modulators 130 is reduced by the first analog filter 120. In these embodiments, the gain of the amplifier 150 is decided based on thermal noise suppression requirements. The comparator is a simple positive feedback latch with just a pair of transistors working as the pre-amplifier and isolating the positive feedback node from the integrating nodes of the modulator. The feedback DAC is implemented by switched resistors.

In accordance with the above-described operations, the sigma-delta modulator (SDM) includes a quantizer 125 and a first feedback arrangement. The quantizer 125 generates multiple digital output signals, each output signal, having a delay with respect to a reference voltage signal ($V_1, V_2, V_3$). In one embodiment, the quantizer 125 includes three single bit noise shaped sigma-delta modulators 130 coupled in parallel. Each single bit noise shaped sigma-delta modulator 130 includes a respective comparator 136 driven by the respective reference voltage signals (e.g., V1, V2, and V3).

In some embodiments, a second analog filter 134 performs an inverse noise shaping function on output signal generated by each comparator 136 by combining with the respective reference voltage. In these embodiments, the comparator 136 compares the feedback signal to the reference voltage signal to generate comparison data. Further, each single bit noise shaped sigma-delta modulator 130 includes a second feedback arrangement, where the comparison data is fed back to the comparator 136.

In addition, outputs of each comparator are combined through the third summer/subtractor 140. In these embodiments, 2 bit digital output generated by the quantizer 125 is amplified (e.g., using the amplifier 150) and the amplified 2 bit digital signal is fed back to the first analog filter 120 through the first summer/subtractor 110.

In these embodiments, the first analog filter 120 performs an inverse noise shaping function on input analog error signal by comparing with the feedback signal generated by the 2 bit DAC 160. Further, the processed signal is applied to the quantizer 125, which is a 2-bit data converter. In order to compensate for quantization noise imparted to the signal by quantizer 125, the 2 bit digital output signal is fed back to the first summer/subtractor 110, where the quantization noise is suitably noise shaped out of the analog input error signal.

In the event that the unit elements (e.g., capacitors, resistors, current sources, and the like) of the 1 bit DAC 138 are not perfectly matched, an error may result in the feedback signal produced by each of the comparators 138. These errors are combined through the third summer/subtractor 140 and fed back to the first analog filter 120 through the first summer/subtractor 110 and the 2 bit DAC 160 as illustrated in FIG. 1. Such feedback arrangement minimizes mismatch error caused by the comparators 138 of each of the single bit noise shaped sigma-delta modulator 130.

Figure 2:
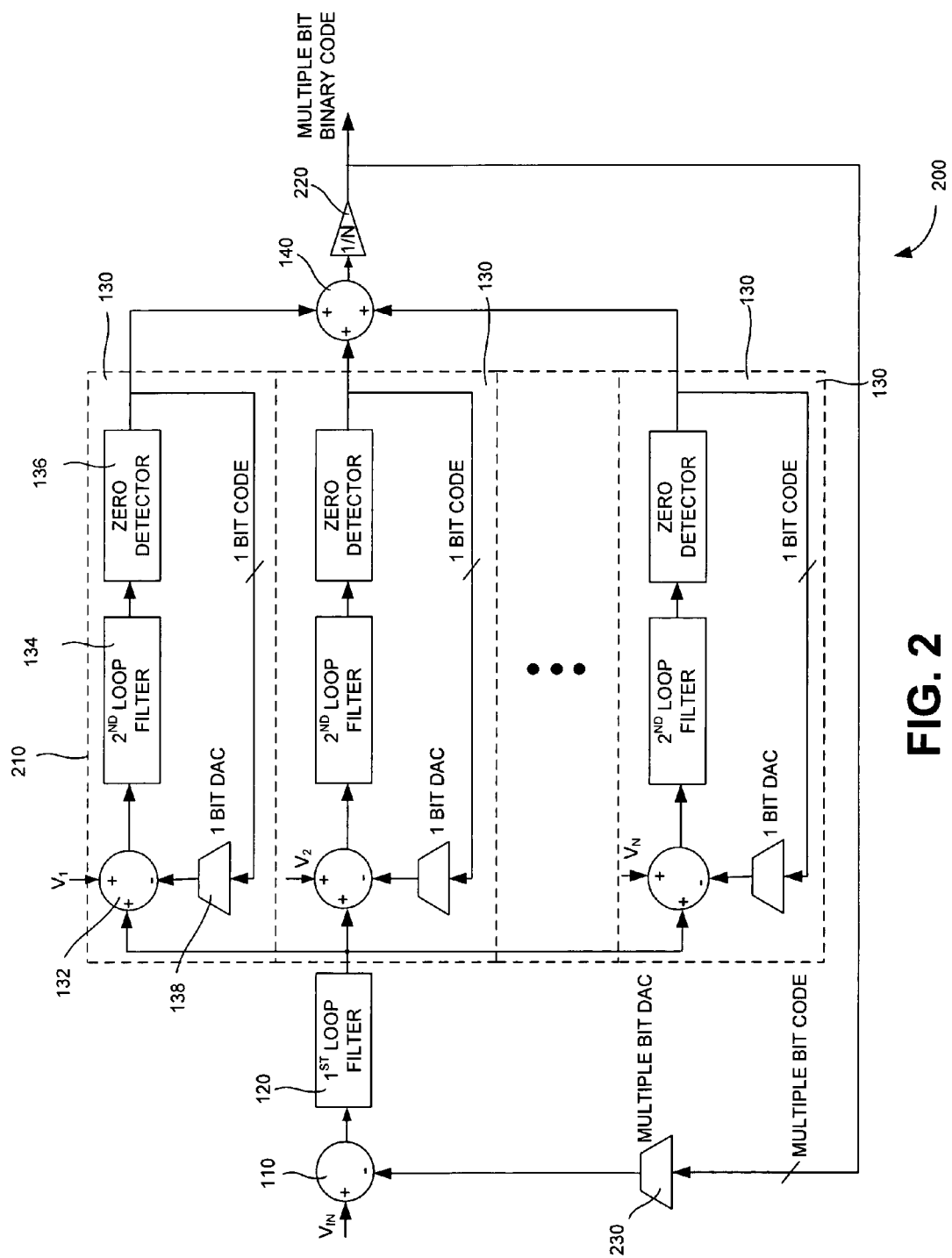
FIG. 2 illustrates a block circuit diagram of a general multibit sigma delta modulator, according to one embodiment.

FIG. 2 illustrates a block circuit diagram 200 of a general multibit sigma delta modulator, according to one embodiment. Particularly, FIG. 2 illustrates the first summer/subtractor 110, the first loop filter 120, a quantizer 210 including multiple single bit noise shaped modulators 130, the third summer/subtractor 140, an amplifier 220, and a multiple bit DAC 230 for converting an analog input signal ($V_{in}$) into a multibit digital output signal. As described-above, each single bit noise shaped modulator 130 includes a second summer/subtractor 132, a second analog filter 134, a comparator or a zero detector 136, and a single bit DAC 138 to generate an associated digital signal.

The multibit sigma delta modulator is designed using multiple single bit noise shaped modulators 130 connected in parallel with different reference voltages (e.g., $V_1, V_2 \ldots V_n$ as illustrated in FIG. 2). In these embodiments, the multi-bit DAC includes several parallel single bit Digital-to-Analog Converters 138 (e.g., through thermometric coding), with each DAC 138, driven by a single bit noise shaped modulator 130. The multi-bit sigma delta modulator works as a single bit modulator 130, with each comparator 136 working at a time.

In operation, the first summer/subtractor 110 combines the quantizer feedback signal with the received analog input error signal and generates a first intermediate error signal. The first loop filter 120 filters the analog input error signal and outputs the filtered analog input error signal to the quantizer 210. Further, the quantizer 210 is configured to quantize the filtered analog input error signal. In these embodiments, the quantizer 210 includes a reference signal generator to generate multiple reference signals (e.g., $V_1, V_2 \ldots V_n$, as shown in FIG. 2).

In operation, the multiple single bit noise shaped modulators 130 include multiple comparators 136 coupled to the reference signal generator to receive associated multiple reference signals and the filtered analog input error signal and to generate a comparison data. An encoder coupled to the quantizer is used to receive the comparison data and generate multibit digital output signal. Further, a first feedback arrangement with at least one DAC 230 coupled to the quantizer for supplying to the first analog filter 120 a quantizer feedback signal based on the multibit digital output signal.

In operation, a third summer/subtractor 140 is used to receive digital output signal from each of the multiple single bit noise shaped modulators 130 and output the multibit digital output signal. Further, the amplifier 220 is used to receive the multibit digital output signal and to amplify the quantizer feedback signal. In these embodiments, the multibit DAC 230 coupled between an output of the amplifier 220 and the first summer/subtractor 110 converts the quantizer feedback signal to an analog feedback signal.

In accordance with the above described operations, an analog input error signal is received (e.g., using the first analog filter 120 of FIG. 2). The analog input error signal is compared to multiple reference signals (e.g., $V1, V2 \ldots V_n$) by a quantizer (e.g., includes multiple single bit noise shaped modulators 130) to generate comparison data. A multibit digital output signal is generated based upon the comparison data. Further, the multiple reference signals are received by the associated single bit noise shaped modulators 130. A quantizer feedback signal is received based on the multibit digital output signal. In addition, the quantizer feedback signal is combined (e.g., using the first summer/subtractor 110 of FIG. 2) with the analog input error signal to generate a first intermediate error signal that is outputted to the quantizer 210.

The above technique is suitable for low voltage, deep submicron digital process. Further, Over Sampling Rate (OSR) of the sigma delta modulators can be increased without introducing any comparator offset and/or speed limitation. The above-described topology of the sigma delta modulators can achieve a faster operation and lower noise. The above architecture can facilitate in low signal swing design, thereby allowing usage of high density capacitors and can still provide a high distortion performance. The above technique can facilitate in realizing a very high clock (~GHz) rate multi-bit sigma delta modulator that uses significantly lower power.

The multibit SDM with multi-level quantizer 210 can be implemented with several single bit SDM loop. Hence, the high loop gain requirements and tight offset requirements for the multi-level quantizer can be performed as a single bit SDM and reduce mismatch error between the multiple single bit noise shaped modulators 130.

The above-described multibit sigma delta modulator is invariant to the comparator offset. Therefore, the kickback noise is reduced by designing a comparator having minimum gate area for the comparator input pair. This method also improves the speed of the comparator to an extent, minimum size devices are required to build the comparator.

The number of quantizer levels of the SDM may be increased without increasing loop gain or reducing clock speed. Also, the mismatch of the individual noise shaped modulators 130 does not affect, as this error gets shaped by the first loop filter 120.

The multi-bit DAC 230 is implemented by multiple parallel single bit DAC 138 (thermometric coding), each driven by a single bit noise shaped modulator 130. The multi-bit modulator works as a single bit modulator with each single bit noise shaped modulator 130 working at a time. For example, a very small input may be applied to the SDM (e.g., 30-40 dB lower than peak operating input). The power level reported by each comparator-DAC pair is measured by digital post processing. The ratio of the power levels will correspond to the ratio of the DAC coefficient mismatch. For example, 3 measurements are carried out separately for the 2 bit quantizer-DAC pair in this implementation. The ratio of the power level of these 3 measurements provides the ratio of the coefficients needed to combine the three bit thermometric data to its correct digital equivalent.

The multibit SDM is sensitive to the phase noise beyond the signal bandwidth of the modulator. In this design the SDM noise is maintained low (e.g., till 10 MHz), hence the modulator will have a good immunity to the clock phase noise below 10 Mhz.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A sigma delta modulator comprising:
   A. first summer/subtractor circuitry having a summing input, a subtractor input, and an output;
   B. first loop filter circuitry having an input connected with the output of the first summer/subtractor circuitry and having an output;
   C. second summer/subtractor circuitry having plural summing inputs and an output;
   D. amplifier circuitry having an input connected to the output of the second summer/subtractor circuitry and having a plural bit output;
   E. digital to analog converter circuitry having an input connected to the output of the amplifier circuitry and having an output connected to the subtractor input of the first summer/subtractor circuitry; and
   F. quantizer circuitry having an input connected to the output of the first loop filter circuitry and including plural single bit noise shaped modulator circuitry, each modulator circuitry including:
      i. third summer/subtractor circuitry having a summing input connected with the input of the quantizer circuitry, a summing input connected with a reference voltage, a subtractor feedback input, and an output,
      ii. second loop circuitry having an input connected with the output of the third summer/subtractor circuitry and an output,
      iii. comparator circuitry having an input connected with the output of the second loop circuitry and an output connected with an input of the second summer/subtractor circuitry, and
      iv. second digital to analog circuitry having an input connected with the output of the comparator circuitry and having an output connected with the subtractor feedback input of the third summer/subtractor circuitry.

2. The modulator of claim 1 in which each modulator circuitry is connected with a different reference voltage.

3. The modulator of claim 1 in which there are three modulator circuitries, one modulator circuitry is connected with a positive reference voltage, a second modulator circuitry is connected with a neutral reference voltage different, and a third modulator circuitry is connected with a negative reference voltage.

* * * * *